United States Patent
Yoon et al.

(10) Patent No.: US 6,243,302 B1
(45) Date of Patent: Jun. 5, 2001

(54) APPARATUS FOR OUTPUTTING DATA USING COMMON PULL-UP/PULL-DOWN LINES WITH REDUCED LOAD

(75) Inventors: Min-Ho Yoon; Jong-Hee Han, both of Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/605,306

(22) Filed: Jun. 28, 2000

(30) Foreign Application Priority Data

Jun. 28, 1999 (KR) .................................................. 99-24840

(51) Int. Cl.[7] .................................................. G11C 7/00
(52) U.S. Cl. .................................. 365/189.05; 365/189.11; 365/230.08; 365/233
(58) Field of Search ........................ 365/189.05, 189.11, 365/230.08, 233, 230.06, 194, 203

(56) References Cited

U.S. PATENT DOCUMENTS

| | | |
|---|---|---|
| 5,481,497 | 1/1996 | Yamaguchi et al. . |
| 5,537,353 | 7/1996 | Rao et al. . |
| 5,600,607 | 2/1997 | Furutani et al. . |
| 5,773,999 | * 6/1998 | Park et al. .......................... 327/108 |
| 5,844,845 | * 12/1998 | Tahara ............................. 365/189.05 |
| 5,920,511 | 6/1999 | Lee et al. . |
| 5,959,474 | * 9/1999 | Park et al. .......................... 327/112 |
| 6,011,751 | 1/2000 | Hirabayashi . |

FOREIGN PATENT DOCUMENTS

| | | | |
|---|---|---|---|
| 11-134860 | 5/1999 | (JP) | ................................ G11C/11/34 |
| 11-195296 | 7/1999 | (JP) | ............................. G11C/11/413 |
| 11-203868 | 7/1999 | (JP) | ................................ G11C/11/34 |
| 11-213668 | 8/1999 | (JP) | ................................ G11C/11/34 |
| 11-265581 | 9/1999 | (JP) | ................................ G11C/11/34 |

\* cited by examiner

*Primary Examiner*—David Nelms
*Assistant Examiner*—Gene N. Auduong
(74) *Attorney, Agent, or Firm*—Jacobson, Price, Holman & Stern, PLLC

(57) ABSTRACT

A synchronous memory device includes: a plurality of pipelatch circuits storing data as pull-up and pull-down signals, transferring the stored data to pull-up and pull-down lines and producing initialization signals to initialize the pull-up and pull-down lines in response to a pipe count signal; common pull-up and pull-down lines coupled to the pull-up and pull-down lines in response to the pipe count signal and the initialization signals; initialization unit for supplying a power supply to the pull-up and pull-down lines in response to a reset signal, the pipe count signal and the initialization signals; an output buffer outputting the data transferred by the common pull-up and pull-down lines; and a precharging unit for precharging the pull-up and pull-down lines and the common pull-up and pull-down lines in response to an output signal from the output buffer, wherein the common pull-up and pull-down lines is precharged to a ground voltage level.

4 Claims, 5 Drawing Sheets

APPARATUS FOR OUTPUTTING DATA USING COMMON PULL-UP/PULL-DOWN LINES WITH REDUCED LOAD

FIELD OF THE INVENTION

The present invention relates to a double data rate (DDR) synchronous dynamic random access memory (SDRAM); and, more particularly, to a data output apparatus for outputting data stored in pipelatch circuits using common pull-up/pull-down lines which is controlled by a precharge unit.

DESCRIPTION OF THE PRIOR ART

Generally, synchronous dynamic random access memory (hereinafter, referred to as SDRAM) operating in synchronization with an external clock signal has been widely used to increase the speed thereof. SDRAM is synchronized with a rising edge of the external clock signal, but double data rate (DDR) SDRAM is synchronized with rising and falling edges of the external clock signal. Therefore, the DDR DRAM may increase operation speed twice as fast as SDRAMs without increasing the frequency of clock signal so that they are focused on the next generation DRAM devices. Furthermore, to process data continuously read out from memory cells, a plurality of pipeline latch circuits have been used in the SDRAMs.

In case where SDRAMs or DDR SDRAMs employing two-bit prefetch circuits, an output node of driver for driving an output buffer is shared with the prefetch circuits temporarily storing data read out from cells. Especially in 128 DDR SDRAMs, the output node is shared with 8 pipelatches. Therefore, when data are read out from one of them, the others act as a load with the increase of the access time.

Also, the output node of the pipelatches is made up of inverters having PMOS and NMOS transistors. In case of such a CMOS driver, the drivability of the PMOS transistor is a half of that of the NMOS transistor so that the PMOS transistor has to be twice as large as the NMOS transistor. As a result, the PMOS transistor has an amount of load twice as much as the NMOS transistor.

SUMMARY OF THE INVENTION

It is, therefore, an object of the present invention to provide an improved high speed DDR SDRAM with a reduced load in the pipelatch circuits.

In accordance with an aspect of the present invention, there is provided a synchronous memory device comprising: a plurality of pipelatch circuits storing data as pull-up and pull-down signals, transferring the stored data to pull-up and pull-down lines and producing initialization signals to initialize the pull-up and pull-down lines in response to a pipe count signal; common pull-up and pull-down lines coupled to the pull-up and pull-down lines in response to the pipe count signal and the initialization signals; initialization means for supplying a power supply to the pull-up and pull-down lines in response to a reset signal, the pipe count signal and the initialization signals; an output buffer outputting the data transferred by the common pull-up and pull-down lines; and a recharging mean for precharging the pull-up and pull-down lines and the common pull-up and pull-down lines in response to an output signal from the output buffer, wherein the common pull-up and pull-down lines is precharged to a ground voltage level.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

Hereinafter, a data output apparatus according to the present invention will be described below referring to the accompanying drawings.

Figure 1:
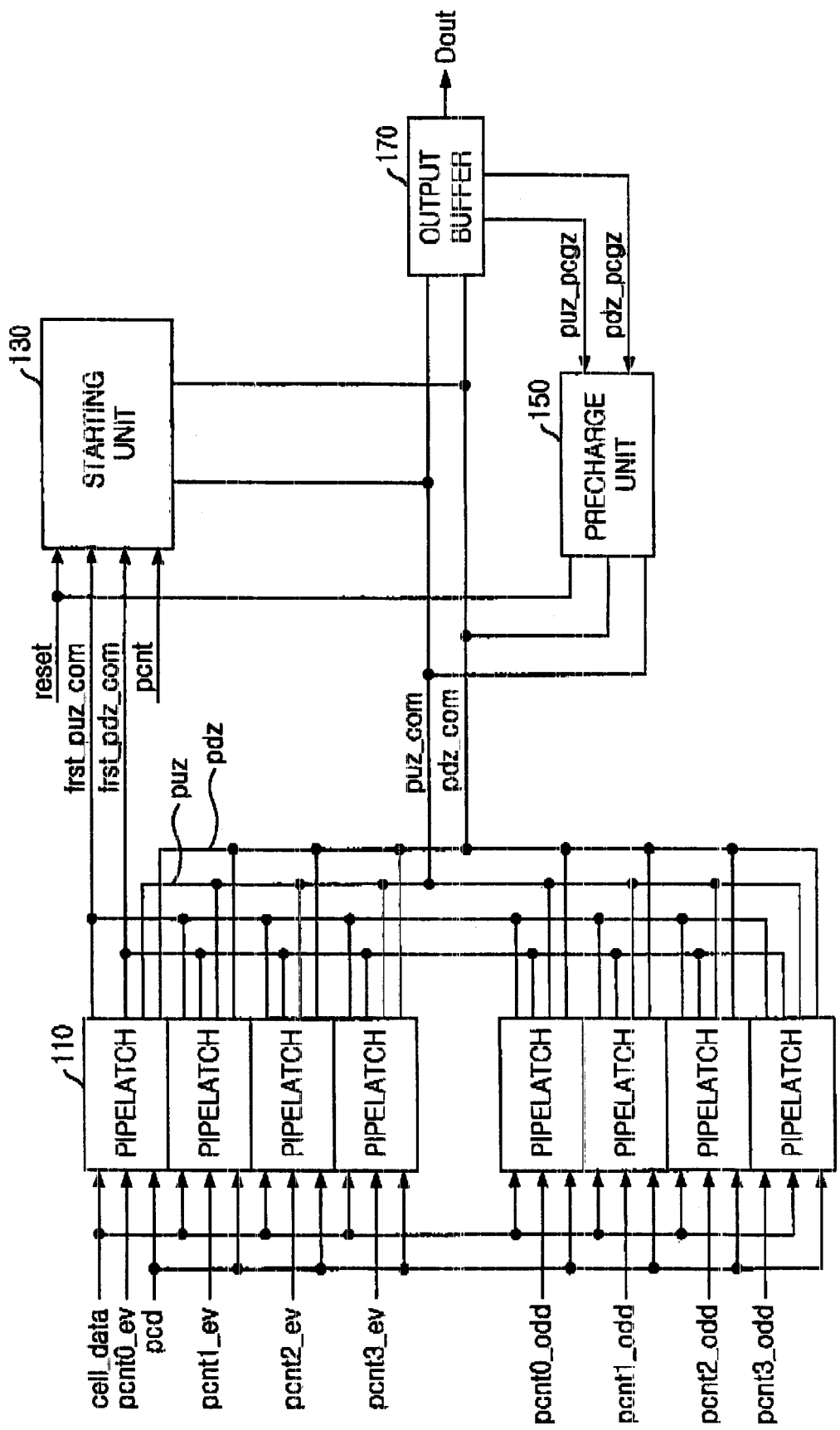
FIG. 1 is a block diagram illustrating an output stage of DDR SDRAM according to the present invention.

First, referring to FIG. 1, a data output stage in the DDR SDRAM according to the present invention includes a plurality of pipelatch units 110, an starting unit 130, a precharge unit 150 and an output buffer 170.

The pipelatch unit 110 receiving cell data transfers the latched data in the form of pull-up/pull-down signal to common pull-up/pull-down lines puz/pdz in response to a pipe count signal pcnt and also produces pull-up/pull-down line initializing common signals frst_puz_com/frst_pdz_com to initialize the pull-up/pull-down lines puz/pdz using the first data. During data output period, normal state of pull-up/pull-down lines puz/pdz is logic "high". When pcnt is activated, one of puz and pdz is pulled down to logic "low" depending on the latched data. After that data is latched into the flip-flop, the said pulled-down puz/pdz is precharged to logic "high", that precharge action is done by unit 150. At the initial stage, pull-up/pull-down lines puz/pdz are initialized to logic "low". At this initial stage, one of puz/pdz should be pulled up depending on the latched data. Each pipelatch unit 110 can drive frst_puz_com/frst_pdz_com and send the information to the starting unit 130. The starting unit 130 receives the frst_puz_com/frst_pdz_com and drives pull-up/pull-down lines puz/pdz to logic "high". After this first driving at the pipelatch unit 110, this pipelatch unit 110 is de-activated until reset is activated and initialize the starting unit 130.

The starting unit 130 applies a power supply voltage level to the pull-up/pull-down lines puz/pdz in response to a reset signal, the pipe count signal and the pull-up/pull-down line initializing command signals frst_puz_com/frst_pdz_com. The precharge unit 150 precharges the common pull-up/pull-down lines puz_com/pdz_com to the power supply voltage level in response to the reset signal and pull-up/pull-down precharge signals puz_pcgz/pdz_pcgz from the output buffer 170. The output buffer 170 outputs the transferred data from the pipelatch units 110 and produces the pull-up/pull-down precharge signals puz_pcgz/pdz_pcgz which are input into the precharge unit 150. Accordingly, since the precharge unit 150 prechages the pull-up/pull-down lines after the final data output is carried out in the output buffer 170, a stable data output may be guaranteed.

Figure 2:
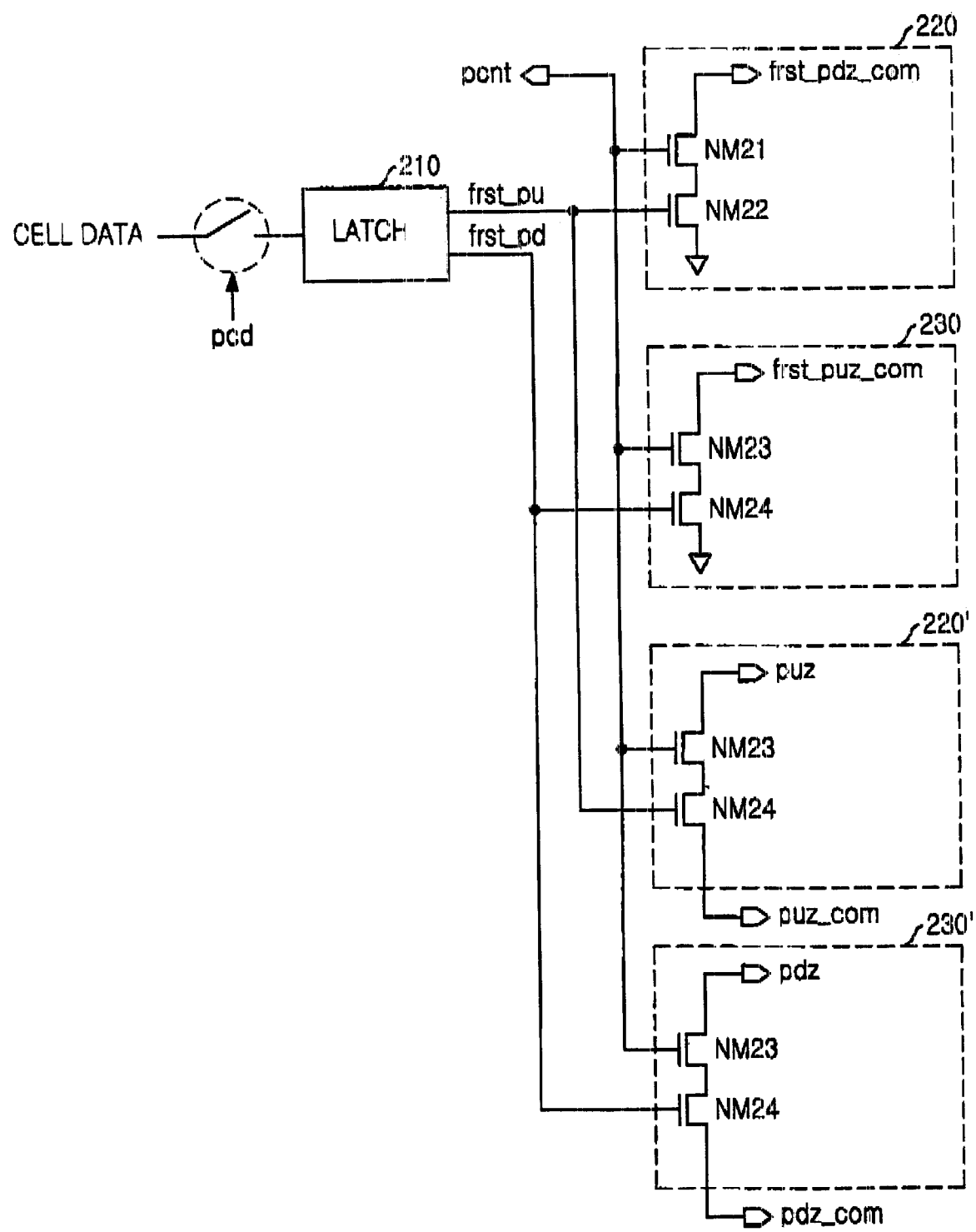
FIG. 2 is a block diagram illustrating a pipelatch in FIG. 1.

Referring to FIG. 2, the pipelatch 110 includes a latch circuit 210, which stores the cell data as pull-up/pull-down signals under the control of a pipelatch control signal pcd, and a plurality of NMOS transistors NM21 to NM28 to carry out the pull-down operations. That is, pull-down units 220 and 230 and switching units 220' and 230' are employed to pull down the signal lines frst_pdz_com, frst_puz_com, puz and pdz.

The NMOS transistors NM23 and NM24 in the pull-down unit 230, which have gates respectively receiving the pipe count signal pcnt and the pull-down signal frst_pd, carry out a pull-down operation on the signal line of the pull-up line initializing command signal frst_puz_com. Alos, the NMOS transistors NM21 and NM22 in the pull-down unit 220, which have gates respectively receiving the pipe count signal pcnt and the pull-up signal frst_pu, carry out a pull-down operation on the signal line of the pull-down line initializing command signal frst_pdz_com.

Figure 3:
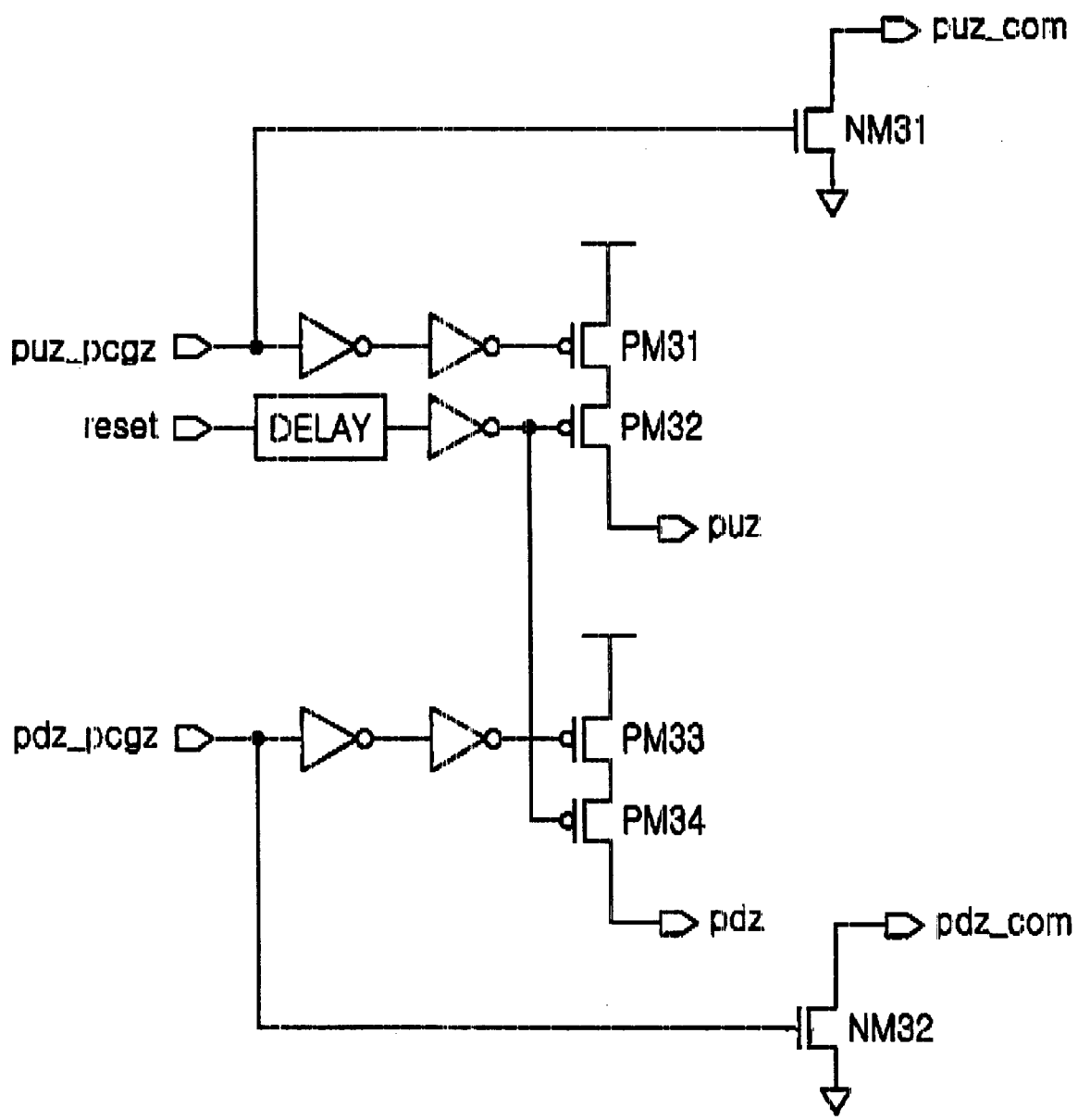
FIG. 3 is a block diagram illustrating a precharge unit in FIG. 1.

On the other hand, the NMOS transistors NM25 and NM26 in the switching unit 220', which have gates respectively receiving the pipe count signal pcnt and the pull-up signal frst_up, couple the pull-up line puz to the common pull-up line puz_com and also the NMOS transistors NM27 and NM28 in the switching unit 230', which have gates respectively receiving the pipe count signal pcnt and the pull-down signal frst_pd, Referring to FIG. 3, the precharge unit 150 includes a plurality of PMOS transistors PM31 to PM34 and NMOS transistors NM31 and NM32. The PMOS transistors PM31 and PM32 are coupled between a power supply and the pull-up line puz of each pipelatch unit 110 in FIG. 1 and also the PMOS transistors PM33 and PM34 are coupled between a power supply and the pull-down line pdz of each pipelatch unit 110 in FIG. 1. The PMOS transistor PM31 receives the pull-up precharge signal puz_pcgz from the output buffer 170 and also the PMOS transistor PM33 receives the pull-down precharge signal pdz_pcgz from the output buffer 170. The pull-up and pull-down operations are controlled by the reset signal received by the PMOS transistors PM32 and PM34. Furthermore, the pull-up precharge signals puz_pcgz and the pull-down precharge signal puz_pcgz are respectively applied to the NMOS transistors NM31 and NM32, thereby carrying out pull-down operation on the common pull-up/pull-down lined puz_com/pdz_com.

Figure 4:
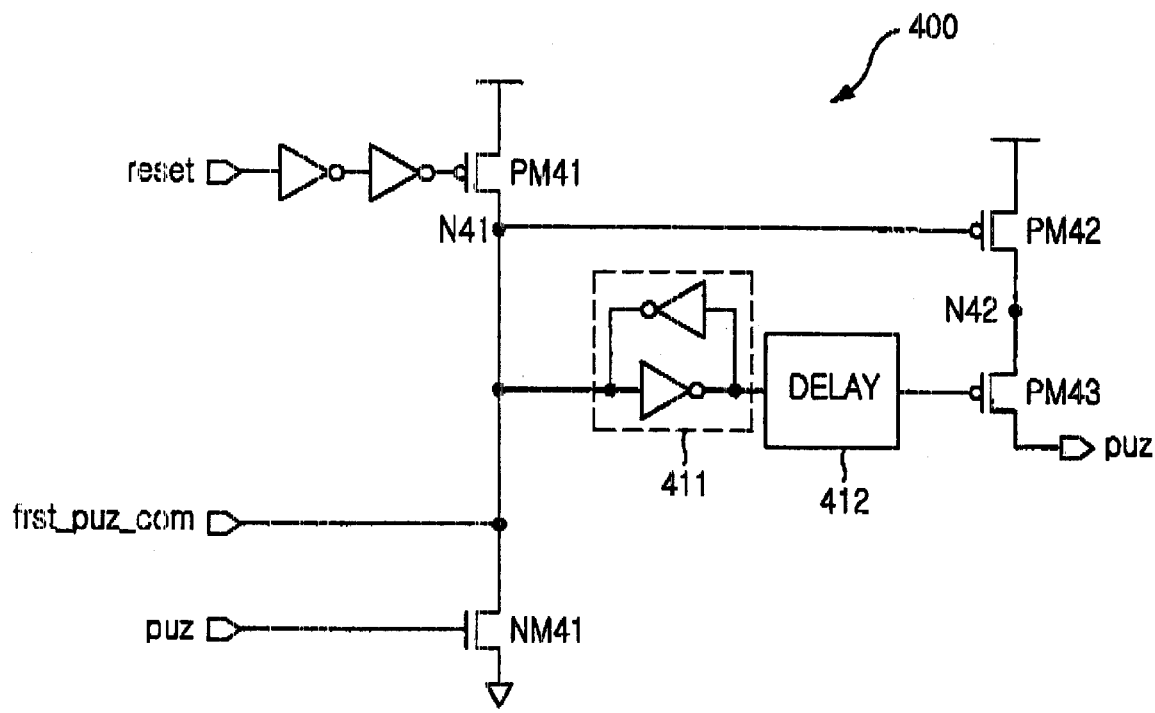
FIG. 4 is a block diagram illustrating a pull-up and pull-down initializing unit in FIG. 1.
Figure 4:
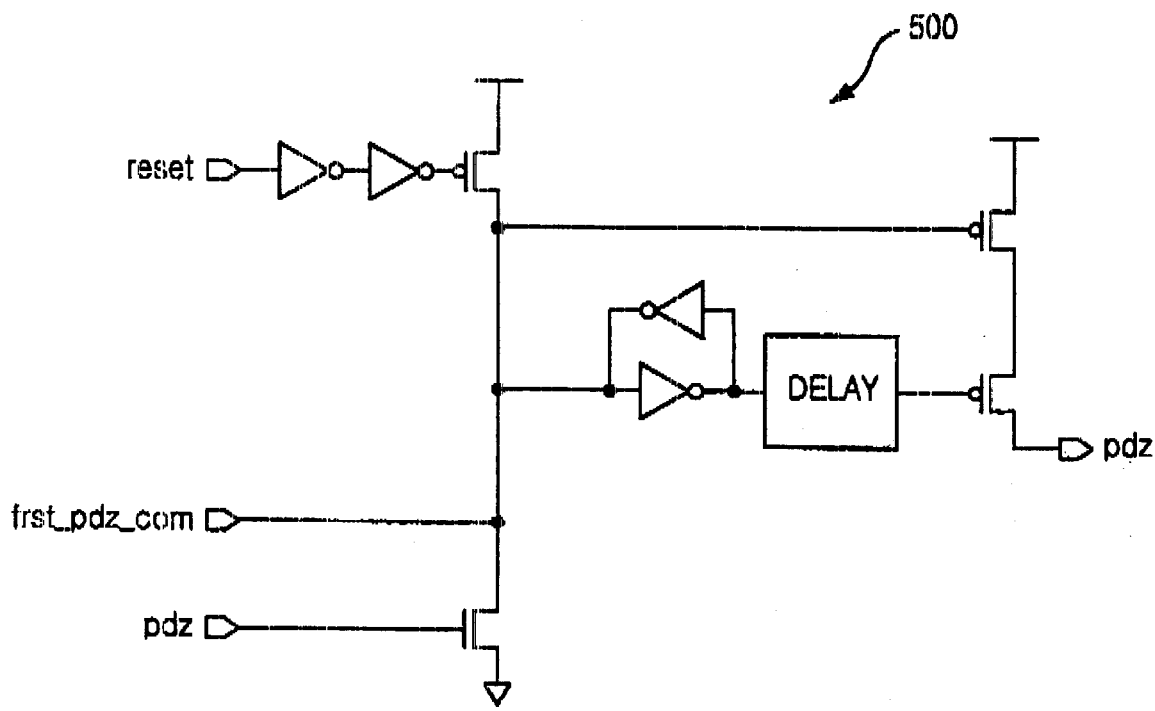

Referring to FIG. 4, the starting unit 130 to initialize the pull-up/pull-down lines connected to each pipelatch unit 110 includes a pull-up line initialization unit 400 and a pull-down line initialization unit 450. The pull-up line initialization unit 400 includes a plurality of PMOS transistors PM41 to PM43 and NMOS transistor NM41, a latch circuit 411 and a delay 412 coupled to the latch circuit 411.

The PMOS transistor PM41 carries out the pull-up operation on node N41 in response to the reset signal rest and the latch circuit 411 coupled to node N41 has two inverters to maintain the signal on node N41. The PMOS transistor PM42 carries out the pull-up operation on node N42 in response to a voltage level on node N41 and the PMOS transistor PM43, which is coupled to a drain of the PMOS transistor PM42, provides a pull-up signal for the pull-up line puz in response to an output signal from the delay 412. The NMOS transistor NM41, whose gate is coupled to the pull-up line puz, performs the pulls-down operation on node N41 in response to an output signal provided from the pull-up line puz. At this time, the pull-up line initialization common signal frst_puz_com is outputted from the drain of the NMOS transistor NM41. Accordingly, after the delay time determined by the delay 412, the voltage level on node N41 is set to a ground voltage level.

Likewise, the pull-down line initialization unit 500 includes the same elements as the pull-up line initialization unit 400, except for being coupled to the pull-down line pdz instead of the pull-up line puz.

Figure 5:
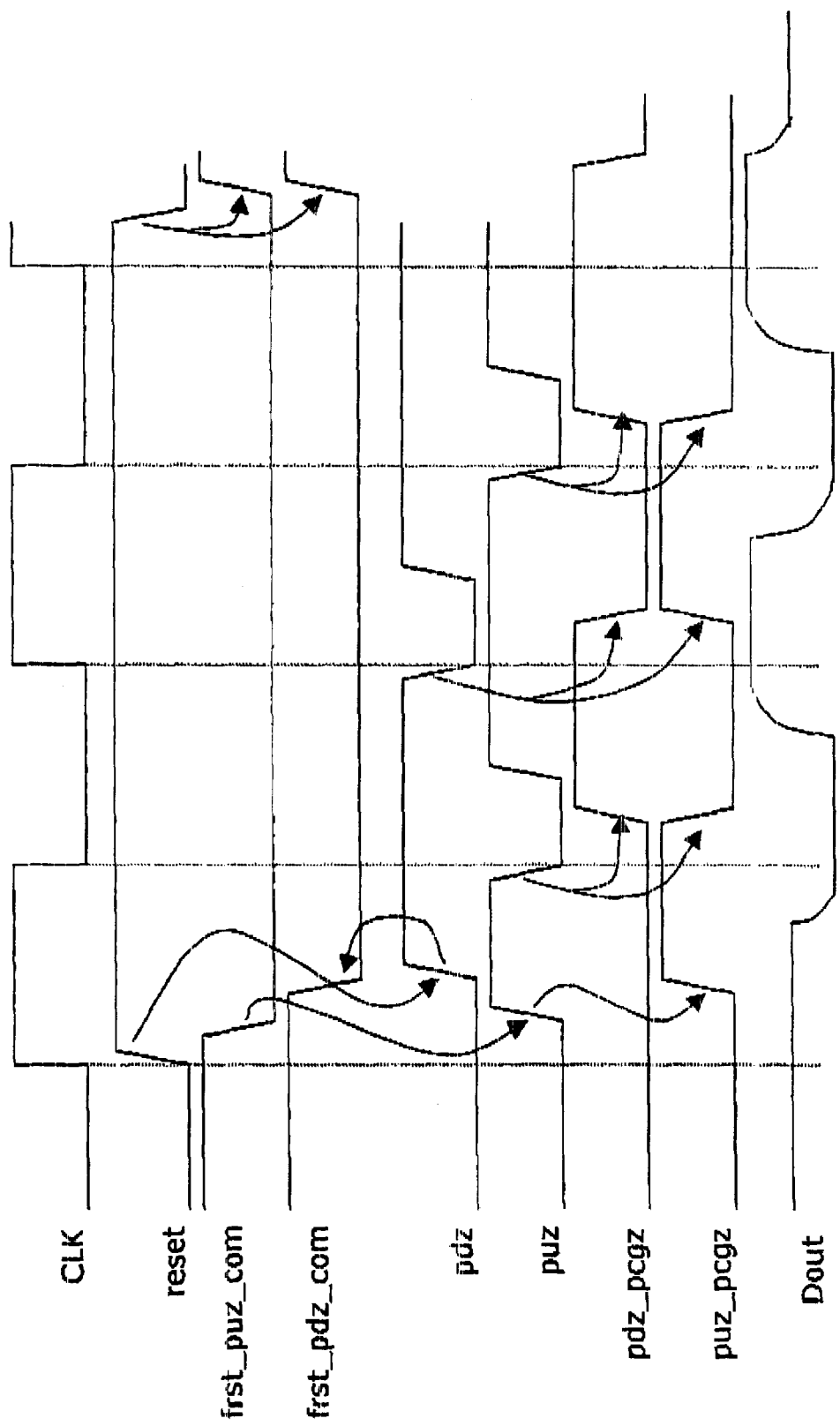
FIG. 5 is a block diagram illustrating an output buffer in FIG. 1.

Referring to FIG. 5, in an initial state, the pull-up/pull-down lines puz/pdz is set to a low voltage level and it should be precharged to a high voltage level in order to drive the output terminal of the pipelatch 110 having only NMOS transistors.

The precharge signal for the pull-up/pull-down lines puz/pdz is activated after the data are transferred through the output buffer 170 and a high voltage signal is initially applied to the pull-up/pull-down lines puz/pdz by the starting unit 130. In case where the pull-down signal frst_pd from the initial data is in a high voltage level and the pipe count signal pcnt is activated in a high voltage level, the initialization of the pull-up/pull-down lines puz/pdz is carried out when the pull-up line initializing command signal frst_puz_com, in a low voltage level, is applied to the pull-up line initialization unit 400. The pull-up line initialization unit 400 pulls up node N41 in response to the reset signal and turns on the PMOS transistor PM43 through the latch circuit 411 and the delay 412. The pipe count signal pcnt and the pull-up line initializing command signal frst_puz_com are activated. Accordingly, since the PMOS transistor PM42, the gate of which is connected to node N41, is turned on and the PMOS transistor PM42 has been already turned on, these two PMOS transistors carry out the pull-up operation in the pull-up line puz. As a result, after the pull-up/pull-down signals are applied to the output buffer 170 through the pull-up/pull-down lines puz/pdz, respectively and the data are output, the pull-up/pull-down precharge signals puz_pcgz/pdz_pcgz are activated and applied to the precharge unit 150 precharging the pull-up/pull-down lines puz/pdz.

As described above, the precharged common pull-up line puz_com in a high voltage level may be in a low voltage level when the pull-up signal frst_pu from the latch circuit 210 is in a high voltage level according to the input data and, on the contrary, the precharged common pull-down line pdz_com in a high voltage level may be in a low voltage level when the pull-up signal frst_pd is in a high voltage level according to the input data. It should be noted that the data output DOUT is in a high voltage level when the common pull-up line puz_com is in a low voltage level and also the data output DOUT is in a low voltage level when the common pull-down line puz_com is in a low voltage level. On the other hand, in case where the pull-up signal frst_pu from the first data is applied in a high voltage level, the pull-down line pdz is first activated in a high voltage level.

As apparent from the above, the amount of load at the output node of the pipelatch circuit may be increased, by driving the output driver only using the NMOS transistors. This decrease of the load may decrease the delay time due to the load at the output node.

What is claimed is:

1. A synchronous memory device, comprising:
    a plurality of pipelatch circuits storing data as pull-up and pull-down signals, transferring the stored data to pull-up and pull-down lines and producing initialization signals to initialize the pull-up and pull-down lines in response to a pipe count signal;
    common pull-up and pull-down lines coupled to the pull-up and pull-down lines in response to the pipe count signal and the initialization signals;
    initialization means for supplying a power supply to the pull-up and pull-down lines in response to a reset signal, the pipe count signal and the initialization signals;
    an output buffer outputting the data transferred by the common pull-up and pull-down lines; and
    a precharging mean for precharging the pull-up and pull-down lines and the common pull-up and pull-down lines in response to an output signal from the output buffer, wherein the common pull-up and pull-down lines is precharged to a ground voltage level.

2. The synchronous memory device recited in claim 1, wherein the pipelatch circuit comprises:

a first pull-down means for producing a control, signal to provide the power supply to the pull-down line in response to the pipe count signal and the stored data;

a second pull-down means for producing a control signal to provide the power supply to the pull-up line in response to the pipe count signal and the stored data;

a first switching means for coupling the pull-up line to the common the pull-up line in response to the pipe count signal and the stored data; and a second switching means for coupling the pull-down line to the common the pull-down line in response to the pipe count signal and the stored data.

3. The synchronous memory device as recited in claim 2, wherein the initialization means comprises pull-up/pull-down line initialization units, wherein the pull-up line initialization unit comprises a pull-up means for providing the power supply to the pull-up line after a predetermined time in response to the pipe count signal and an output signal from the pipelatch circuit, and wherein the pull-down line initialization unit comprises a pull-up means for providing the power supply to the pull-down line after a predetermined time in response to the pipe count signal and an output signal from the pipelatch circuit.

4. The synchronous memory device as recited in claim 1, wherein the synchronous memory device is a double data rate (DDR) dynamic random access memory (DRAM).

* * * * *